(12) United States Patent
Rajavel (10) Patent No.: US 8,093,559 B1
(45) Date of Patent: Jan. 10, 2012

(54) METHODS AND APPARATUS FOR THREE-COLOR INFRARED SENSORS

(75) Inventor: Rajesh D. Rajavel, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 378 days.

(21) Appl. No.: 12/326,883

(22) Filed: Dec. 2, 2008

(51) Int. Cl.
*G02F 1/01* (2006.01)

(52) U.S. Cl. .......... 250/330; 250/338.1; 250/338.4; 250/370.12; 250/370.13; 257/188; 257/189; 257/190; 257/442; 257/615

(58) Field of Classification Search .......... 250/330, 250/338.1, 338.4, 370.12, 370.13; 257/188, 257/189, 190, 442, 614, 615
See application file for complete search history.

(56) References Cited

U.S. PATENT DOCUMENTS

| | | | | |
|---|---|---|---|---|
| 4,679,063 A * | 7/1987 | White | .......... | 257/187 |
| 4,847,489 A * | 7/1989 | Dietrich | .......... | 250/226 |
| 5,093,580 A * | 3/1992 | Sting | .......... | 250/559.16 |
| 5,113,076 A * | 5/1992 | Schulte | .......... | 250/370.06 |
| 5,216,244 A * | 6/1993 | Esaki et al. | .......... | 250/339.11 |
| 5,229,611 A * | 7/1993 | Ukon | .......... | 250/347 |
| 5,453,727 A * | 9/1995 | Shibasaki et al. | .......... | 338/32 R |
| 5,457,331 A * | 10/1995 | Kosai et al. | .......... | 257/188 |
| 5,581,084 A * | 12/1996 | Chapman et al. | .......... | 250/338.4 |
| 5,729,018 A * | 3/1998 | Wells et al. | .......... | 250/339.08 |
| 5,731,621 A * | 3/1998 | Kosai | .......... | 257/440 |
| 5,977,557 A * | 11/1999 | Kim | .......... | 257/21 |
| 6,043,550 A * | 3/2000 | Kuhara et al. | .......... | 257/461 |
| 6,049,116 A * | 4/2000 | Park et al. | .......... | 257/442 |
| 6,157,020 A * | 12/2000 | Krapf et al. | .......... | 250/214 LA |
| 6,455,908 B1 * | 9/2002 | Johnson et al. | .......... | 257/440 |
| 6,504,222 B1 * | 1/2003 | Miyamoto et al. | .......... | 257/440 |
| 6,803,557 B1 * | 10/2004 | Taylor et al. | .......... | 250/214.1 |
| 7,067,856 B2 * | 6/2006 | Ramdani et al. | .......... | 257/190 |
| 7,671,341 B2 * | 3/2010 | Jones et al. | .......... | 250/370.01 |
| 2002/0195677 A1 * | 12/2002 | Razeghi | .......... | 257/440 |
| 2004/0061056 A1 * | 4/2004 | Barton et al. | .......... | 250/338.4 |
| 2004/0108461 A1 * | 6/2004 | Mitra | .......... | 250/339.02 |
| 2004/0108564 A1 * | 6/2004 | Mitra | .......... | 257/442 |
| 2006/0118722 A1 * | 6/2006 | Pham | .......... | 250/338.4 |
| 2006/0162768 A1 * | 7/2006 | Wanlass et al. | .......... | 136/262 |
| 2006/0164633 A1 * | 7/2006 | Koshoubu et al. | .......... | 356/300 |
| 2007/0075224 A1 * | 4/2007 | Jones et al. | .......... | 250/226 |
| 2008/0111152 A1 * | 5/2008 | Scott et al. | .......... | 257/188 |
| 2009/0121307 A1 * | 5/2009 | Tennant | .......... | 257/440 |

* cited by examiner

*Primary Examiner* — David Porta
*Assistant Examiner* — Djura Malevic
(74) *Attorney, Agent, or Firm* — OConnor & Company (57) ABSTRACT

The present invention provides a two-terminal infrared detector capable of detecting a plurality of bands, such as three bands, over the visible and short-wave infrared bands. Detection of three colors enables one to construct composite imagery that provide significantly added contract in comparison to typical grayscale images. In some variations, the device includes multiple absorber and barrier layers that consist of distinct engineered semiconductor alloys which are closely lattice matched to InP.

42 Claims, 6 Drawing Sheets

METHODS AND APPARATUS FOR THREE-COLOR INFRARED SENSORS

FIELD OF THE INVENTION

The present invention generally relates to methods and systems that detect electromagnetic radiation spectral bands, such as infrared radiation.

BACKGROUND OF THE INVENTION

Imaging systems that detect various electromagnetic radiation spectral bands, including the visible band, and throughout the infrared band, can be used in a variety of applications, such as detection of chemical or biological agents, and anomaly and threat detection. Another application is the ability to see a target in a cluttered environment. One type of image system may use a focal plane array (FPA) to detect infrared radiation. An FPA may be formed from an array of detector elements, such as infrared detector elements, wherein each of the infrared detector elements functions as a pixel to produce an image of the detected items. The change in signal level output of each of the infrared detector elements due to interaction with incident infrared radiation is converted into an electrical signal by a read-out integrated circuit (ROIC).

An infrared image typically provides a grayscale map of objects in a scene. In multi-spectral imaging (MSI), multiple images of a scene or object are created using radiation from different parts of the spectrum. The reflection characteristics of an object in a scene are dependent on the wavelength of light that is being detected. Hence, multi-spectral imagery provides added contrast when compared to a broad-band image.

Broadband detectors, also referred to as single-color detectors that operate in the visible/near-infrared/short-wave infrared (VIS/NIR/SWIR, or VNS) band (0.4 to 2.5 μm), can be fabricated from HgCdTe or InGaAs-based semiconductor materials. Broadband detectors are fabricated from a two-terminal photodiode.

Multi-spectral imagers resolve incident radiation into different wavelength bands, on bin, and send the binned signals back to the ROIC. Multi-spectral detectors are in general more complicated compared to the broadband counterparts because of the need for electrical interconnects to the different absorber elements in the detector. Multi-spectral detectors capable of detecting three or more bands typically require at least three terminals per pixel to operate the device.

InGaAs-based sensors are used widely for night vision and other SWIR imaging applications. However, these sensors are not capable of multi-band sensing and hence provide grayscale images that can be difficult to comprehend. The use of three bands provides added contrast for target identification and discrimination.

What is needed is a two-terminal detector capable of detecting a plurality of bands, such as three bands. It is desirable for a detector to be capable of detecting at least three bands over the visible and short-wave infrared (0.4-2.5 micron) bands. Detection of three bands enables one to construct composite-color imagery that provide significantly added contract in comparison to typical grayscale images.

Furthermore, it is desirable for a detector to operate at ambient temperature or require minimal cooling. There is a commercial need for such a detector that is simple, lightweight, and efficient. It would be further beneficial for such a detector to be suitable as a drop-in upgrade to conventional single-color sensors. The invention described herein can fulfill these needs.

SUMMARY OF THE INVENTION

In some variations, the present invention provides a device for infrared radiation detection, the device comprising:
(a) a first absorber layer having a first conductivity type and a first band gap;
(b) a second absorber layer having a second conductivity type and a second band gap, wherein the first band gap is greater than the second band gap;
(c) a first barrier layer that separates the first absorber layer from the second absorber layer;
(d) a third absorber layer having the first conductivity type and a third band gap, wherein the second band gap is greater than the third band gap;
(e) a second barrier layer that separates the second absorber layer from the third absorber layer;
(f) a two-terminal mesa or planar detector architecture with suitable electrical connections and contact layers to the first and third absorber layers, effective for facilitating application of a bias voltage for tuning a wavelength response; and
(g) a read-out integrated circuit to detect current generated.

In some embodiments, the first conductivity types is n type and the second conductivity type is p type. In other embodiments, the first conductivity type is p type and the second conductivity type is n type.

In some embodiments, the first absorber layer consists substantially of one or more semiconductor alloys that are closely lattice matched to InP, selected from the group consisting of InP, InAlAs, AlGaAsSb, and AlInAsSb. In certain embodiments, the first absorber layer consists substantially of $In_{0.52}Al_{0.48}As$, wherein the $In_{0.52}Al_{0.48}As$ is closely lattice matched to InP.

The second absorber layer, in some embodiments, consists substantially of InGaAlAs or InGaAsP, closely lattice matched to InP. In certain embodiments, the second absorber layer consists substantially of InP.

The second absorber layer, in other embodiments, consists substantially of (i) In, (ii) Ga, (iii) Al, and (iv) either As or P, in an alloy composition that is closely lattice matched to InP.

In some embodiments, the third absorber layer consists substantially of a composition including at least one or more materials selected from a first group consisting of In, Ga, and Al and further including one or more materials selected from a second group consisting of N, P, As and Sb, wherein the composition is closely lattice matched to InP. In certain embodiments, the third absorber layer comprises $In_{0.53}Ga_{0.47}As$, wherein the $In_{0.53}Ga_{0.47}As$ is lattice matched to InP.

Each of the barrier layers can consist essentially of an alloy including one or more materials selected from a first group consisting of In, Al, and Ga, and further including one or more materials selected from a second group consisting of N, P, As, and Sb, wherein the alloy is closely lattice matched to InP. Preferably, the barrier layers are suitable to bridge conduction and valence bands between the first and second absorber layers and between the second and third absorber layers. The first barrier layer and the second barrier layer can optionally have substantially the same composition. The barrier layer can be graded in composition.

Doping levels in the absorber and barrier layers are preferably selected to facilitate band bending upon application of the bias voltage. In various embodiments, the doping levels are selected as follows: first and third absorber doping range:

$5 \times 10^{14}$ to $5 \times 10^{17}$ cm$^{-3}$; second absorber doping range: $5 \times 10^{15}$ to $5 \times 10^{18}$ cm$^{-3}$; and barrier doping range: $1 \times 10^{15}$ to $1 \times 10^{18}$ cm$^{-3}$.

In certain embodiments, the first absorber layer can be n-type InP with a thickness of about 3000 nm and a doping level of about $2 \times 10^{16}$ cm$^{-3}$. The second absorber layer can be p-type In$_{0.52}$Ga$_{0.35}$Al$_{0.13}$As with a thickness of about 3000 nm and a doping level of about $2 \times 10^{18}$ cm$^{-3}$. The third absorber layer of the invention can be n-type In$_{0.53}$Ga$_{0.47}$As with a thickness of about 3000 nm and a doping level of about $2 \times 10^{15}$ cm$^{-3}$. The barrier layer can be p-type In$_{0.52}$Al$_{0.48}$As with a thickness of about 500 nm and a doping level of about $8 \times 10^{16}$ cm$^{-3}$.

The device of the invention can further include a suitable substrate layer or support layer that is adjacent to the first absorber layer. For example, the device can include InP substrate that is adjacent to the first absorber layer.

In some embodiments, the first absorber layer is selected for detection of infrared radiation in a wavelength range of about 0.4 μm to x, wherein x<1.5 μm, such as about 0.9 μm. The second absorber layer can be selected for detection of infrared radiation in the wavelength range of about x to about y, wherein y is less than 2.0 μm, and wherein y>x. The third absorber layer can be selected for detection of infrared radiation in the wavelength range of about y to z, where z<2.5 μm, such as about 1.7 μm.

To enable practical use in some devices of the invention, a suitable substrate layer or support layer, adjacent to the first absorber layer, is substantially removed. Devices provided herein can be used, for example, as focal-plane arrays among other uses. Some variations of this invention provide a device for infrared radiation detection, the device including three absorber layers, wherein the device is capable of detecting x distinct bands of infrared radiation when a bias voltage is stepped or ramped in magnitude. The value of x can be 1, 2, or 3 bands, in various embodiments. When x is at least 2 bands, at least one of the bands can be obtained by band subtraction from a plurality of bands to obtain an individual band. In some embodiments, at least one of the bands is obtained by subtracting the signal generated by an individual band from the signal generated by two bands. In some embodiments, each of the individual bands is obtained by subtracting the signal generated by two bands from the signal generated by three bands.

The device, wherein x=2 or more, can be operated such that only one band is detected. Or, when x=3, the device can be operated such that any two bands can be detected.

In other variations, the present invention provides a method for infrared radiation detection, the method comprising:

(i) providing a device having x absorber layers, x-1 barrier layers that each separate two distinct absorber layers, at least one mesa or planar structure in connection with a metal contact suitable to bias the device, and a read-out integrated circuit, wherein x is at least 2;

(ii) subjecting the device to an input infrared radiation source;

(iii) producing a detection current in the device from the infrared radiation source; and (iv) providing an effective bias swing for detecting x distinct bands associated with the infrared radiation source.

In some embodiments of these methods, the bias swing is selected from about ±0.5 V to about ±5 V, such as about ±1.75 V. The distinct bands of infrared radiation fall preferably (but not necessarily) within about 0.4-2.5 μm.

Preferred embodiments provide for generating a composite false-color image. Preferred embodiments do not require or include cooling. However, devices may be cooled to reduce the dark current depending on the available signal and lighting conditions.

Existing single-color infrared radiation detectors can be upgraded by providing the device of this invention, as a replacement detector.

BRIEF DESCRIPTION OF THE DRAWINGS

FIG. 3 illustrates the utility of some embodiments of the invention.

DETAILED DESCRIPTION OF EMBODIMENTS OF THE INVENTION

The apparatus and methods of the present invention will now be described in detail by reference to various non-limiting embodiments of the invention.

Unless otherwise indicated, all numbers expressing dimensions, wavelengths, efficiencies, and so forth used in the specification and claims are to be understood as being modified in all instances by the term "about." Without limiting the application of the doctrine of equivalents to the scope of the claims, each numerical parameter should at least be construed in light of the number of reported significant digits and by applying ordinary rounding techniques.

Certain preferred embodiments of the present invention will now be described in more detail, by reference to the accompanying figures. The figures are understood to provide representative illustration of the invention and are not limiting in their content. It will be understood by one of ordinary skill in the art that the scope of the invention extends beyond the specific embodiments depicted. This invention also incorporates routine experimentation and optimization of the methods, apparatus, and systems described herein.

In some embodiments, this invention provides sensors that detect three separate bands in the infrared (IR) region of the electromagnetic spectrum (such as near infrared, NIR to shortwave infrared, SWIR). Band tunability allows for the generation of a composite, false-color image in the IR, making it easier for the human brain to comprehend. As is known in the art, color images provide for enhanced detection of objects and anomalies in a scene.

The VIS/NIR/SWIR (VNS) band, which describes electromagnetic wavelengths of about 0.4 to 1.7 μm, is particularly an attractive band since IR detectors operating in this band need little or no cooling. A relaxation of cooling requirements enables the use of VNS sensors in a multitude of civilian and military applications, including (but not limited to) process control, production or assembly, intelligence surveillance, and reconnaissance.

In preferred embodiments, the invention utilizes a two-terminal detector based on alloys that are closely lattice matched to InP. For purposes of the description herein, a material is "closely lattice matched to InP" if its lattice constant is within one-half of one percent of that of InP. Specific examples of such materials include, but are by no means limited to, InP, InGaAlAs, InAlAs, InGaAs, and InGaAsP. In other embodiments of the invention, HgCdZnTe-based semiconductor materials can be employed in place of InP.

To detect three distinct bands of IR radiation according to some embodiments of the invention, three discrete absorbers can be separated by thin wide-band-gap barriers for reducing band-to-band cross-talk. Spectral cross-talk is a measure of electromagnetic energy leakage from one spectral band to another. Preferably, such cross-talk is minimized.

In some embodiments, the invention provides a device capable of detecting three distinct bands of infrared radiation, the device comprising:

(a) a first absorber layer having a first conductivity type and a first band gap;

(b) a second absorber layer having a second conductivity type and a second band gap, wherein the first band gap is greater than the second band gap;

(c) a first barrier layer that separates the first absorber layer from the second absorber layer;

(d) a third absorber layer having the first conductivity type and a third band gap, wherein the second band gap is greater than the third band gap;

(e) a second barrier layer that separates the second absorber layer from the third absorber layer;

(f) a two-terminal mesa or planar detector architecture with suitable electrical connections and contact layers to the first and third absorber layers, effective for facilitating application of a bias voltage for tuning a wavelength response; and (g) a read-out integrated circuit to detect current generated.

For example, such a device can be depicted according to FIG. 1. A cross-sectional view of an exemplary epitaxial structure 100 is illustrated in FIG. 1A. This epitaxial structure 100 includes a substrate 105, a first absorber layer 110, a first barrier layer 115, a second absorber layer 120, a second barrier layer 125, and a third absorber layer 130. Epitaxial structure 100 can be grown by fabrication means well-known in the art.

Figure 1A:
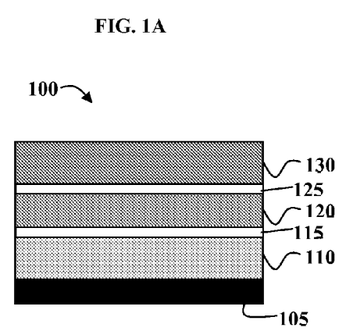
FIG. 1 illustrates an exemplary device of the invention for detecting infrared radiation, according to some embodiments.

The substrate 105 can consist substantially of (i.e., comprise), for example, InP or another material closely lattice matched to InP. The first absorber 110 can comprise InP, or another material closely lattice matched to InP, such as InAlAs, AlGaAsSb or AlInAsSb in some embodiments. In some embodiments, first absorber 110 comprises AlGaAsSb. The quaternary alloy in the second absorber 120 can be $In_xGa_yAl_{1-x-y}As$, wherein x=0.52, y=0.0 to 0.48, and x+y≦1.0. The second absorber 120 can comprise a quaternary alloy such as InGaAlAs or InGaAsP. The third absorber 130 can comprise $In_xGa_{1-x}As$, wherein x=0.53, in various embodiments. In certain embodiments, the third absorber 130 can comprise InGaAsSb or InGaNAsSb. The alloy compositions of the absorbers are such that they are closely lattice matched to the substrate.

The barrier layers 115 and 125 may comprise $In_xAl_{1-x}As$, wherein x=0.3-0.7. In some embodiments, the barrier layers 115 and 125 may comprise an alloy consisting of InAlAs, InGaAlAs, AlGaAsSb or AlInAsSb. The first barrier layer and second barrier layer can have substantially the same composition, as a matter of convenience, but the barrier layers can certainly be of different compositions.

To reduce or eliminate band edge discontinuities, band gap grading in the quaternary alloys is preferably employed. Abrupt discontinuities in the bands can cause "notches" which impede the flow of carriers. Such abrupt discontinuities can be substantially avoided by using thin layers (such as approximately 50 nm) to grade between the band gaps of the different materials. Preferred materials used for grading are quaternary alloys, whose band gaps can be varied by changing the alloy composition, while preserving lattice matching to the InP family. Some examples of quaternary alloys used to achieve grading are InGaAlAs and InGaAsP.

In some specific embodiments, the first absorber layer is selected for detection of infrared radiation in the wavelength range of about 0.4-0.92 μm; the second absorber layer is selected for detection of IR in the range of about 0.92 μm to about a wavelength z, wherein z is greater than 0.92 μm and less than 1.5 μm; and the third absorber layer is selected for detection of IR in the range of about a wavelength z to about 1.65 μm.

Figure 1B:
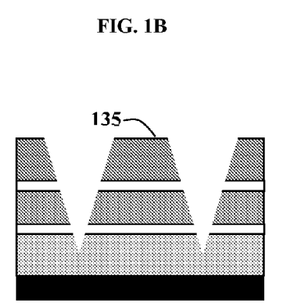
Figure 1C:
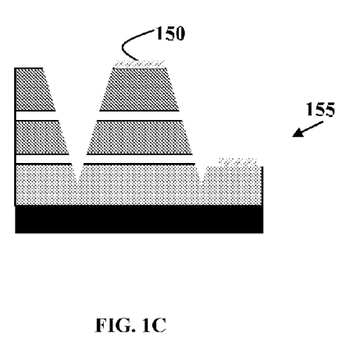
Figure 1D:
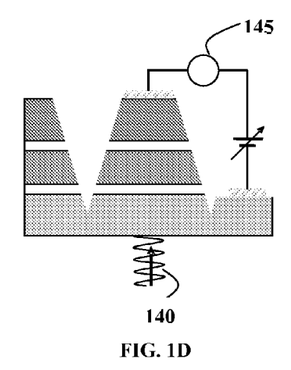

Following the growth of the epitaxial structure stack 100, mesa structures 135 may be delineated by a wet or dry chemical etch process. An etched mesa structure 135 is illustrated in FIG. 1B. The mesa structures may optionally be passivated using an appropriate material, such as SiN (not shown). Metal contacts 150, 155 are deposited on top of the mesa structure and to the bottom layer, respectively, to bias the device (FIG. 1C). A suitable detector for the device is shown in FIG. 1D, wherein the substrate 105 has been substantially removed (for example, after adding the metal contacts 150, 155). The detector includes a read-out integrated circuit 145 or other means for reading a signal 140.

In other embodiments, rather than etching mesa structures, suitable junctions can be either diffused or implanted into a planar structure during fabrication. As will be recognized by a skilled artisan, the present invention is not limited to any particular fabrication method of devices for signal detection.

Figure 2A:
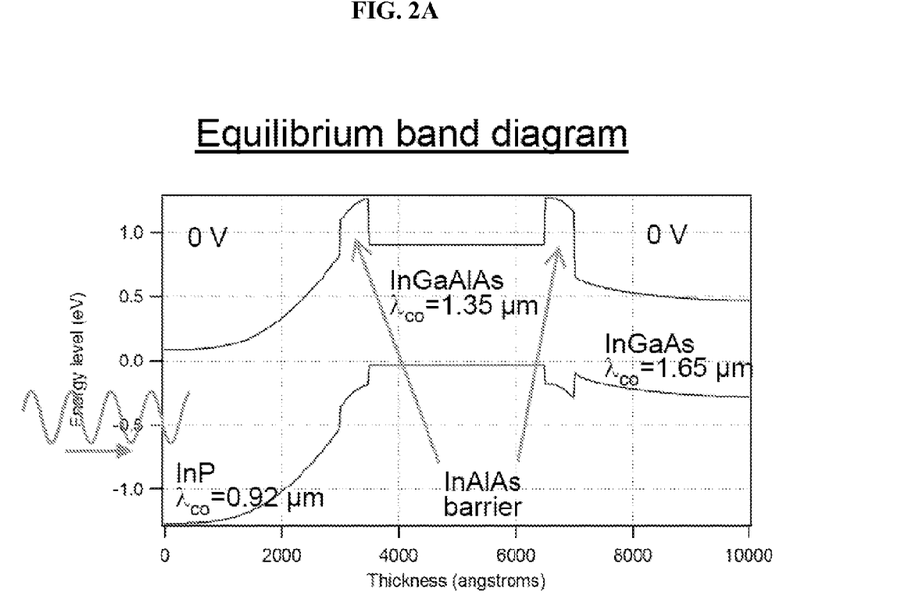
FIG. 2A depicts an equilibrium band diagram (no applied bias) for a three-color IR detector provided by some embodiments of the invention.

An exemplary embodiment of the invention can be further described with reference to FIG. 2. In this example, a device employs a double-barrier design that includes InP, InGaAlAs, InAlAs, and InGaAs alloys. The band gaps of the device are engineered such that a bias swing of ±1.75 V can give wavelength tenability over three bands, and being capable of generating three-color composite images, as will now be further described. Note that in the following description, blue, yellow, and red refer to bands in the SWIR with increasing wavelengths but should not be construed as limiting the invention in any way. FIG. 2A illustrates the equilibrium (no applied bias) band diagram of the presently described three-color detector.

Figure 2B:
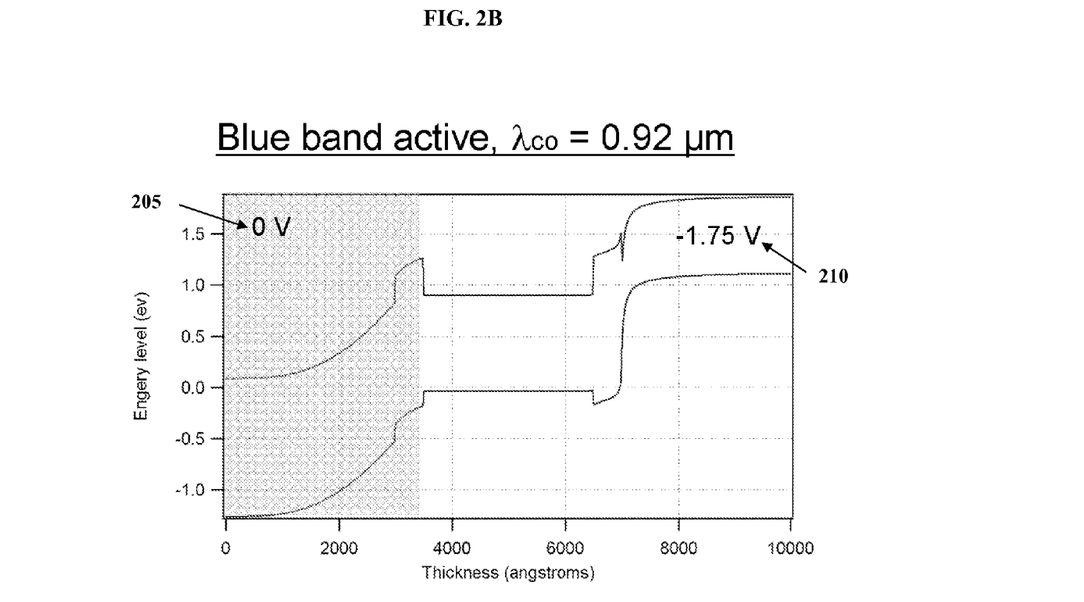
FIG. 2B depicts biasing conditions suitable for detecting the blue band in a three-color IR detector provided by some embodiments of the invention.

FIG. 2B illustrates the band structures on the application of a bias 0 V/−1.75 V. The application of the bias "pulls" the InGaAs up, allowing for the un-impeded flow of the minority carriers (holes) from the n-type InP layer, to the read-out integrated circuit 145 (ROIC). The photo-generated electrons in the InGaAlAs layer are not collected, due to the barrier in the conduction band energy between the InP and InGaAlAs layers. This bias condition produces a response in InP, and is here assigned to the blue band. Small band discontinuities can be eliminated by appropriate grading of the barrier layer or by the application of a suitable bias.

Figure 2C:
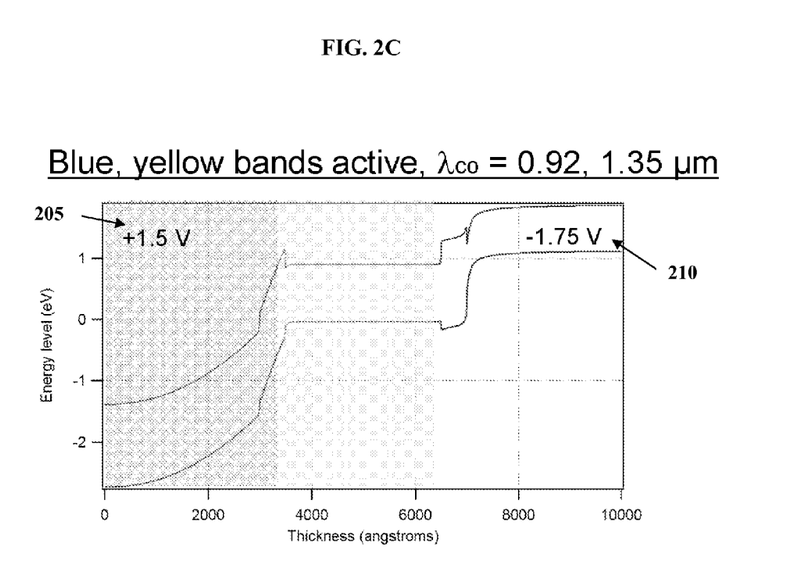
FIG. 2C depicts biasing conditions suitable for detecting the blue and yellow bands in a three-color IR detector provided by some embodiments of the invention.

By pulling the InP bands down, through the application of a +1.5 V bias to InP, the electron barrier between InP and InGaAlAs is decreased, thereby enabling the flow of minority carriers (electrons) from p-type InGaAlAs through InP (FIG. 2C). This bias condition results in a response that is assigned here to blue plus yellow. The yellow response is readily obtained by subtracting the blue response in accordance with FIG. 2B.

Figure 2D:
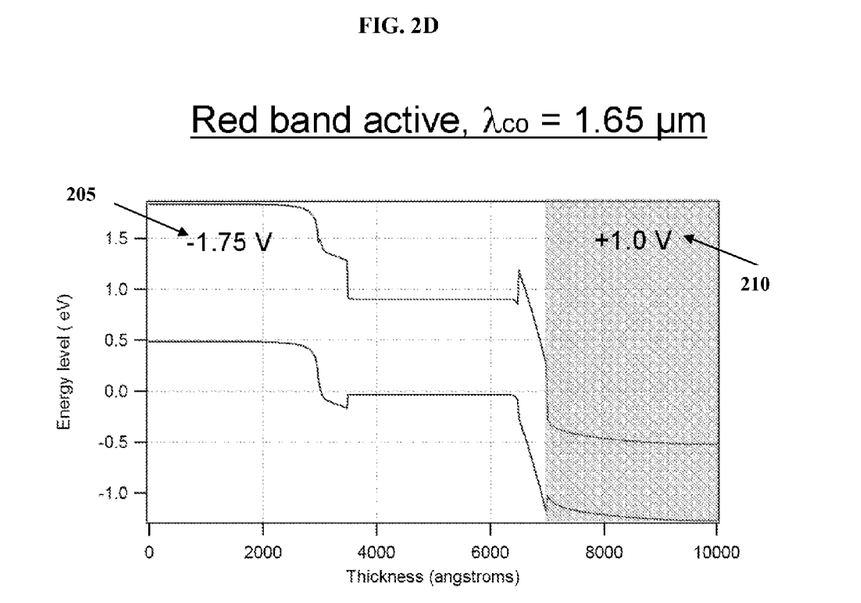
FIG. 2D depicts biasing conditions suitable for detecting the red band in a three-color IR detector provided by some embodiments of the invention.

The application of −1.75 V and +1.0 V to InP and InGaAs, respectively, produces a response in the red band, due to the flow of photo-excited holes from the InGaAs absorber layer, to the left (FIG. 2D).

In this example according to FIGS. 2A-2D, an electromagnetic wave (signal) can enter through the wide band gap material, and the photo carriers can be collected by a ROIC at the narrow band gap side. Between the three absorber layers are barrier layers, which here are InAlAs. The abrupt change in the band gap energies between the absorbers and the barriers produces a discontinuity between the valence and conduction band energy levels. An offset in the valence and conduction band energy levels can oppose the flow of electrons (in the conduction band) and holes (in the valance bands). By applying a suitable bias 205, 210, or by grading the composition of the barriers, the energy offsets can be reduced to facilitate the flow of carriers.

Through adjusting the bias voltages 205, 210 (FIGS. 2B-2D) sequentially, the blue, yellow, and red responses can be obtained, either individually or though subtraction. To obtain interleaved three-color imagery at video frame rates, the bias switching speeds should preferably be on the order of 100 Hz. In general, the incident photon signal levels dictate the preferred dwell times in each band.

Embodiments of the present invention have several practical and commercial uses. Enhanced image contrast and discrimination, due to the multi-color image, can allow for easier detection and comprehension by humans. Preferred devices can be lightweight and energy efficient, compared to alternative ways to achieve multi-color images (e.g., a plurality of detectors or cameras). The double-barrier design of the present invention enables three-color detection in a two-terminal device.

Figure 3A:
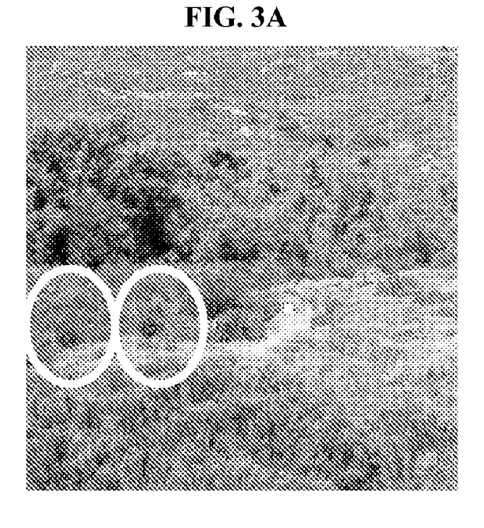
FIG. 3A shows a panchromatic image and FIG. 3B shows a SWIR image of the same scene, generated according to the methods and devices provided herein.
Figure 3B:
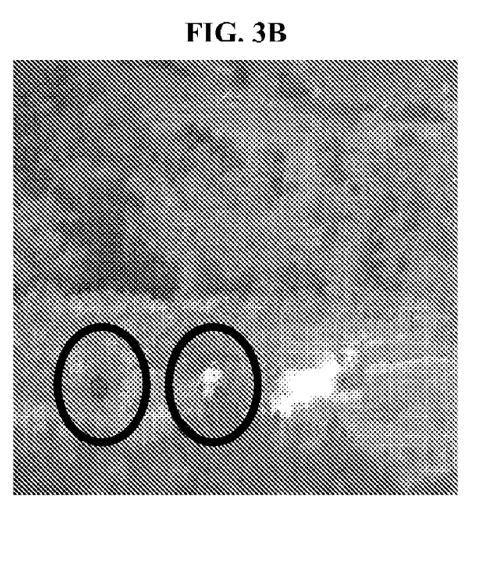

FIG. 3 shows an example of image enhancement provided by an embodiment of the present invention (FIG. 3B, SWIR) compared to a panchromatic image (FIG. 3A). For purposes of illustration in this patent, both images are rendered in black and white, rather than in color. The two circles in both images indicate the same location of the instant scene; the SWIR image in FIG. 3B shows two objects that cannot be readily detected in the image of FIG. 3A.

In certain uses, this invention can add functionality to conventional sensors (e.g., InGaAs-based sensors). The sensor two-terminal device of the present invention can serve as a drop-in upgrade over conventional single-color SWIR sensors.

In this detailed description, reference has been made to multiple embodiments and to the accompanying drawings in which is shown by way of illustration specific exemplary embodiments in which the invention may be practiced. These embodiments are described in sufficient detail to enable those skilled in the art to practice the invention, and it is to be understood that modifications to the various disclosed embodiments may be made by a skilled artisan.

The embodiments, variations, equations, and figures described above should provide an indication of the utility and versatility of the present invention. Of course, many more devices can be developed that involve combinations of device elements as provided herein. For example, devices could be constructed to generate multi-color images with other than 3 colors, such as 2, 4, 5, or more colors. Other embodiments that do not provide all of the features and advantages set forth herein may also be utilized, without departing from the spirit and scope of the present invention. Such modifications and variations are considered to be within the scope of the invention defined by the appended claims.

What is claimed is:

1. A device for infrared radiation detection, said device comprising:
    (a) a first absorber layer having a first conductivity type and a first band gap, wherein said first absorber layer consists substantially of a first semiconductor composition selected from the group consisting of InP, InAlAs, AlGaAsSb, AlInAsSb, and combinations thereof, wherein the stoichiometry of said first semiconductor composition provides a first semiconductor lattice constant that is within one-half of one percent of the lattice constant of InP;
    (b) a second absorber layer having a second conductivity type and a second band gap, wherein said first band gap is greater than said second band gap, and wherein said second absorber layer consists substantially of a second semiconductor composition selected from the group consisting of InGaAlAs, InGaAsP, and combinations thereof, wherein the stoichiometry of said second semiconductor composition provides a second semiconductor lattice constant that is within one-half of one percent of the lattice constant of InP;
    (c) a first barrier layer that separates said first absorber layer from said second absorber layer;
    (d) a third absorber layer having said first conductivity type and a third band gap, wherein said second band gap is greater than said third band gap, and wherein said third absorber layer consists substantially of a third semiconductor composition that includes at least two elements selected from a first group consisting of In, Ga, and Al and further includes at least one element selected from a second group consisting of As, P, N, and Sb, wherein the stoichiometry of said third semiconductor composition provides a third semiconductor lattice constant that is within one-half of one percent of the lattice constant of InP;
    (e) a second barrier layer that separates said second absorber layer from said third absorber layer;
    (f) a two-terminal mesa or planar detector architecture with suitable electrical connections and contact layers to said first and third absorber layers, effective for facilitating application of a bias voltage for tuning a wavelength response; and
    (g) a read-out integrated circuit to detect current generated.

2. The device of claim 1, wherein said first conductivity type is n type and said second conductivity type is p type.

3. The device of claim 1, wherein said first conductivity type is p type and said second conductivity type is n type.

4. The device of claim 1, wherein said first absorber layer consists substantially of InAlAs in a relative stoichiometry of indium and aluminum providing a first semiconductor lattice constant that is within one-half of one percent of the lattice constant of InP.

5. The device of claim 1, wherein said first absorber layer consists substantially of $In_{0.52}Al_{0.48}As$.

6. The device of claim 1, wherein said second absorber layer consists substantially of InGaAlAs in a relative stoichiometry of indium, gallium, and aluminum providing a second semiconductor lattice constant that is within one-half of one percent of the lattice constant of InP.

7. The device of claim 1, wherein said second absorber layer consists substantially of InGaAsP in a relative stoichiometry of indium, gallium, and phosphorous providing a second semiconductor lattice constant that is within one-half of one percent of the lattice constant of InP.

8. The device of claim 1, wherein said third absorber layer consists substantially of a third semiconductor composition selected from the group consisting of InGaAs, InGaAsSb, InGaNAsSb, and combinations thereof, in a relative stoichiometry of indium and gallium providing a third semiconductor lattice constant that is within one-half of one percent of the lattice constant of InP.

9. The device of claim 1, wherein said third absorber layer comprises $In_{0.53}Ga_{0.47}As$.

10. The device of claim 1, wherein each of said barrier layers consists substantially of a composition including at least two materials selected from a first group consisting of In, Al, and Ga, and further including at least two materials selected from a second group consisting of N, P, As, and Sb, wherein said composition is closely lattice matched to InP, and wherein said barrier layers are suitable to bridge conduction and valence bands between said first and second absorber layers and between said second and third absorber layers.

11. The device of claim 1, wherein the thickness of each of said absorber layers is selected from about 100 nm to about 5000 nm.

12. The device of claim 1, wherein said first barrier layer and said second barrier layer have substantially the same composition.

13. The device of claim 1, wherein said first barrier layer and said second barrier layer have the same conductivity type as that of said second absorber layer.

14. The device of claim 1, wherein said first barrier layer and said second barrier layer each have a thickness selected from about 50 nm to about 300 nm.

15. The device of claim 1, wherein doping levels in said absorber and barrier layers are selected to facilitate band bending upon application of said bias voltage.

16. The device of claim 15, wherein:
(i) the doping levels of said first and third absorber layers are selected from $5 \times 10^{14}$ to $5 \times 10^{17}$ cm$^{-3}$;
(ii) the doping level of said second absorber layer is selected from $5 \times 10^{15}$ to $5 \times 10^{18}$ cm$^{-3}$; and
(iii) the doping levels of said first and second barrier layers are selected from $1 \times 10^{15}$ to $1 \times 10^{18}$ cm$^{-3}$.

17. The device of claim 1, further comprising a support layer that is adjacent to said first absorber layer.

18. The device of claim 1, further comprising InP substrate that is adjacent to said first absorber layer.

19. The device of claim 1, wherein a suitable substrate layer or support layer, adjacent to said first absorber layer, has been substantially removed.

20. The device of claim 1, wherein said first absorber layer is selected for detection of infrared radiation in a wavelength range of about 0.4 μm to x, wherein x<1.5 μm.

21. The device of claim 20, wherein x is about 0.9 μm.

22. The device of claim 1, wherein said second absorber layer is selected for detection of infrared radiation in the wavelength range of about x to about y, wherein y is less than 2.0 μm, and wherein y>x.

23. The device of claim 22, wherein said third absorber layer is selected for detection of infrared radiation in the wavelength range of about y to z, where z<2.5 μm.

24. The device of claim 23, wherein z is about 1.7 μm.

25. The device of claim 1, wherein said device is configured for a focal-plane array.

26. A device for infrared radiation detection, said device including three absorber layers, wherein said device is capable of detecting x distinct bands of infrared radiation when a bias voltage is stepped or ramped in magnitude, wherein said three absorber layers consist of a first absorber layer consisting substantially of a first semiconductor composition selected from the group consisting of InP, InAlAs, AlGaAsSb, AlInAsSb, and combinations thereof, wherein the stoichiometry of said first semiconductor composition provides a first semiconductor lattice constant that is within one-half of one percent of the lattice constant of InP; a second absorber layer consisting substantially of a second semiconductor composition selected from the group consisting of InGaAlAs, InGaAsP, and combinations thereof, wherein the stoichiometry of said second semiconductor composition provides a second semiconductor lattice constant that is within one-half of one percent of the lattice constant of InP; and a third absorber layer consisting substantially of a third semiconductor composition that includes at least two elements selected from a first group consisting of In, Ga, and Al and further includes at least one element selected from a second group consisting of As, P, N, and Sb, wherein the stoichiometry of said third semiconductor composition provides a third semiconductor lattice constant that is within one-half of one percent of the lattice constant of InP.

27. The device of claim 26, wherein x is 1 band.

28. The device of claim 26, wherein x is 2 bands.

29. The device of claim 26, wherein x is 3 bands.

30. The device of claim 26, wherein x is at least 2 bands, and wherein at least one of said bands is obtained by band subtraction from a plurality of bands to obtain an individual band.

31. The device of claim 26, wherein at least one of said bands is obtained by subtracting the signal generated by an individual band from the signal generated by two bands.

32. The device of claim 26, wherein each of said individual bands is obtained by subtracting the signal generated by two bands from the signal generated by three bands.

33. A method for infrared radiation detection, said method comprising:
(i) providing a device having x absorber layers, x−1 barrier layers that each separate two distinct absorber layers, at least one mesa or planar structure in connection with a metal contact suitable to bias said device, and a read-out integrated circuit, wherein x is at least 2 and wherein each of said absorber layers and each of said barrier layers is selected to provide a lattice constant that is within one-half of one percent of the lattice constant of InP;
(ii) subjecting said device to an input infrared radiation source;
(iii) producing a detection current in said device from said infrared radiation source; and
(iv) providing an effective bias swing for detecting x distinct bands associated with said infrared radiation source,
wherein a first absorber layer consists substantially of a first semiconductor composition selected from the group consisting of InP, InAlAs, AlGaAsSb, AlInAsSb, and combinations thereof, wherein the stoichiometry of said first semiconductor composition is selected for providing a first semiconductor lattice constant that is within one-half of one percent of the lattice constant of InP; and
wherein a second absorber layer consists substantially of a second semiconductor composition selected from the group consisting of InGaAlAs, InGaAsP, and combinations thereof, wherein the stoichiometry of said second semiconductor composition is selected for providing a second semiconductor lattice constant that is within one-half of one percent of the lattice constant of InP.

34. The method of claim 33, wherein said bias swing is selected from about ±0.5 V to about ±5 V.

35. The method of claim 34, wherein said bias swing is about ±1.75 V.

36. The method of claim 33, wherein said distinct bands of infrared radiation fall within about 0.4-2.5 μm.

37. The method of claim 33, further comprising generating a composite false-color image.

38. The method of claim 33, wherein said method does not include cooling.

39. The method of claim 33, wherein step (i) further comprises the step of upgrading an existing single-color infrared radiation detector by providing said device as a replacement detector.

40. A method for infrared radiation detection, said method comprising use of said device provided according to claim 26, wherein x=2 or 3, and wherein only one band is detected.

41. A method for infrared radiation detection, said method comprising use of said device provided according to claim 26, wherein x=3, and wherein any two bands are detected.

42. A method of making an infrared radiation detector, said method comprising:
(a) providing or fabricating a first absorber layer having a first conductivity type and a first band gap;
(b) providing or fabricating a second absorber layer having a second conductivity type and a second band gap, wherein said first band gap is greater than said second band gap;
(c) providing or fabricating a first barrier layer that separates said first absorber layer from said second absorber layer;
(d) providing or fabricating a third absorber layer having said first conductivity type and a third band gap, wherein said second band gap is greater than said third band gap;
(e) providing or fabricating a second barrier layer that separates said second absorber layer from said third absorber layer;
(f) providing or fabricating a two-terminal mesa or planar detector architecture with suitable electrical connections and contact layers to said first and third absorber layers, effective for facilitating application of a bias voltage for tuning a wavelength response; and
(g) providing or fabricating a read-out integrated circuit capable of detecting current generated,
wherein said first absorber layer consists substantially of a first semiconductor composition selected from the group consisting of InP, InAlAs, AlGaAsSb, AlInAsSb, and combinations thereof, wherein the stoichiometry of said first semiconductor composition is selected for providing a first semiconductor lattice constant that is within one-half of one percent of the lattice constant of InP; said second absorber layer consists substantially of a second semiconductor composition selected from the group consisting of InGaAlAs, InGaAsP, and combinations thereof, wherein the stoichiometry of said second semiconductor composition is selected for providing a second semiconductor lattice constant that is within one-half of one percent of the lattice constant of InP; and said third absorber layer consists substantially of a third semiconductor composition that includes at least two elements selected from a first group consisting of In, Ga, and Al and further includes at least one element selected from a second group consisting of As, P, N, and Sb, wherein the stoichiometry of said third semiconductor composition is selected for providing a third semiconductor lattice constant that is within one-half of one percent of the lattice constant of InP.

\* \* \* \* \*